United States Patent [19]
Persia et al.

[11] Patent Number: 5,574,628
[45] Date of Patent: Nov. 12, 1996

[54] RIGID PCMCIA FRAME KIT

[75] Inventors: Henry J. Persia, Greensboro; Randy G. Simmons, Lewisville, both of N.C.

[73] Assignee: The Whitaker Corporation, Wilmington, Del.

[21] Appl. No.: 443,144

[22] Filed: May 17, 1995

[51] Int. Cl.⁶ .................................................. H05K 1/14
[52] U.S. Cl. .................. 361/737; 361/759; 361/796; 257/679
[58] Field of Search ..................... 361/737, 728, 361/752, 796, 759, 801, 802; 257/678, 679, 730; 235/490, 492; 439/86, 89, 91, 92, 136, 271, 278; 174/50; 364/708

[56] References Cited

U.S. PATENT DOCUMENTS

| | | | |
|---|---|---|---|
| 4,872,091 | 10/1989 | Maniwa et al. | 361/424 |
| 5,153,818 | 10/1992 | Mukougawa et al. | 361/395 |
| 5,210,442 | 5/1993 | Ishimoto | 257/679 |
| 5,339,222 | 8/1994 | Simmons et al. | 361/818 |
| 5,397,857 | 3/1995 | Farguhar et al. | 174/52.1 |

OTHER PUBLICATIONS

Branson Ultrasonics Corporation; "Designing Parts For Ultrasonic Welding"; Technical Information; 1975; Revised Apr. 1994.

Primary Examiner—Leo P. Picard
Assistant Examiner—Y. Whang

[57] ABSTRACT

This invention is directed too a PCMCIA frame kit having improved stability, where the kit is intended to receive a planar electronic device for electrical engagement with a complementary device in electronic equipment. The kit comprises a pair of matable, metal cover members, where each cover member is integrally molded to a dielectric frame upon which the planar electronic device is seated. The improved feature is the provision of each frame including at least a pair of side rails, where at least one side rail pair on one cover member includes plural, circular, upstanding pins having a predetermined diameter, the matable side rail on the other cover member includes a like plurality of holes to receive a corresponding pin. In a preferred embodiment, the cross section of holes exhibits a multi-sided configuration with the diametrical distance between opposing corners being slightly greater than the predetermined diameter, and the diametrical distance between opposing sides in slightly less than the predetermined diameter. By this arrangement a normal force applied between the covers effects a force fit between each respective pin and its multi-sided hole.

20 Claims, 8 Drawing Sheets

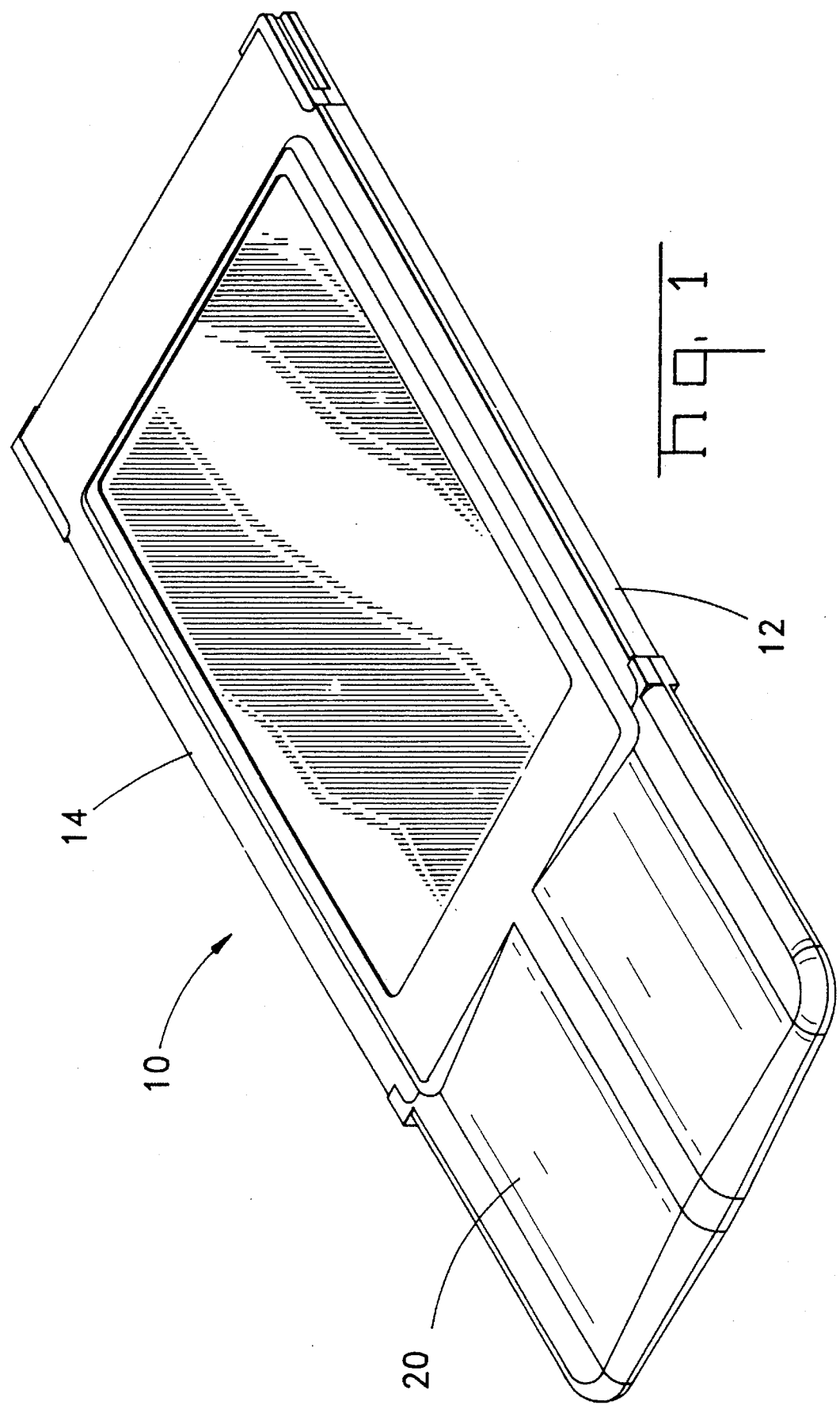

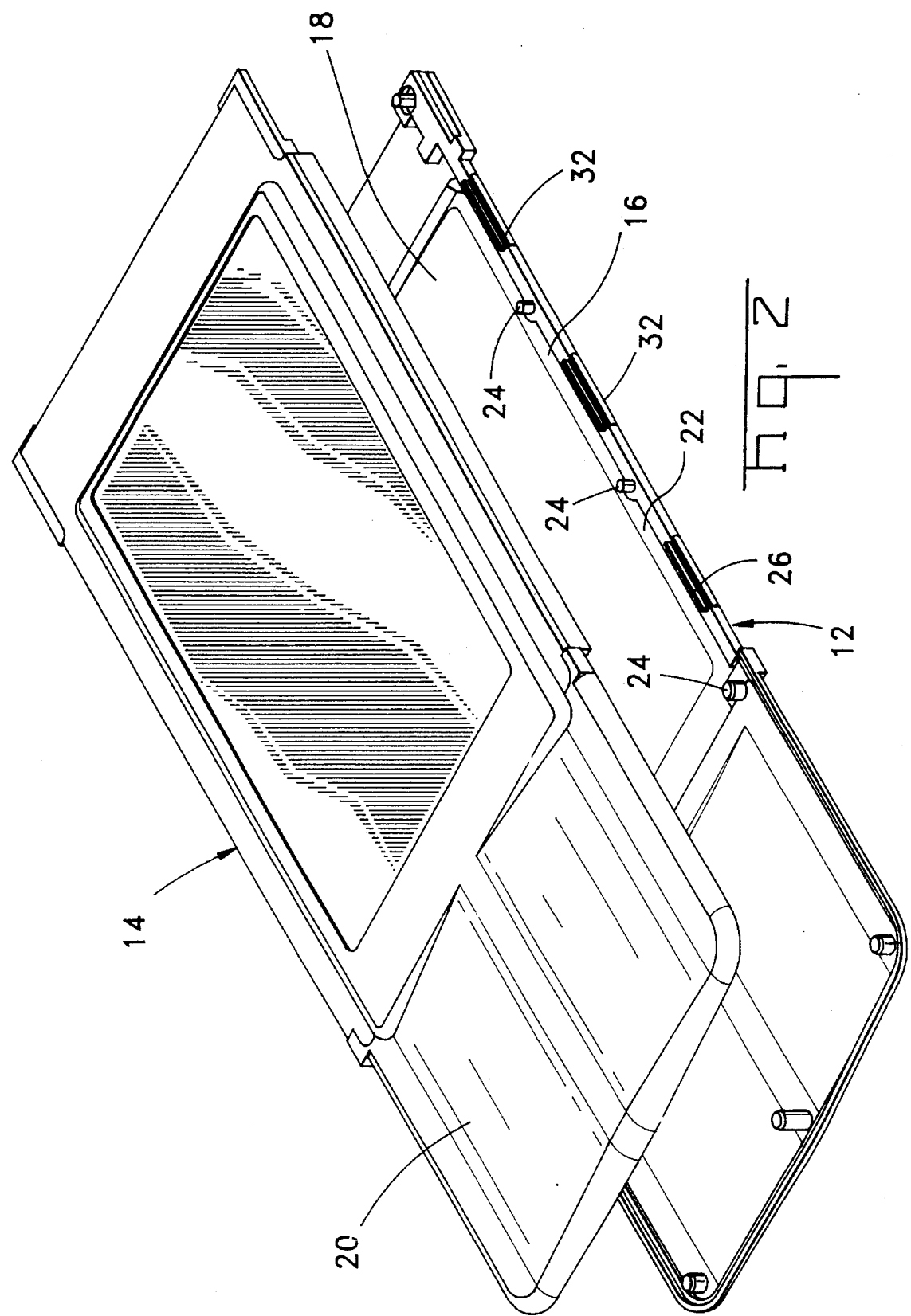

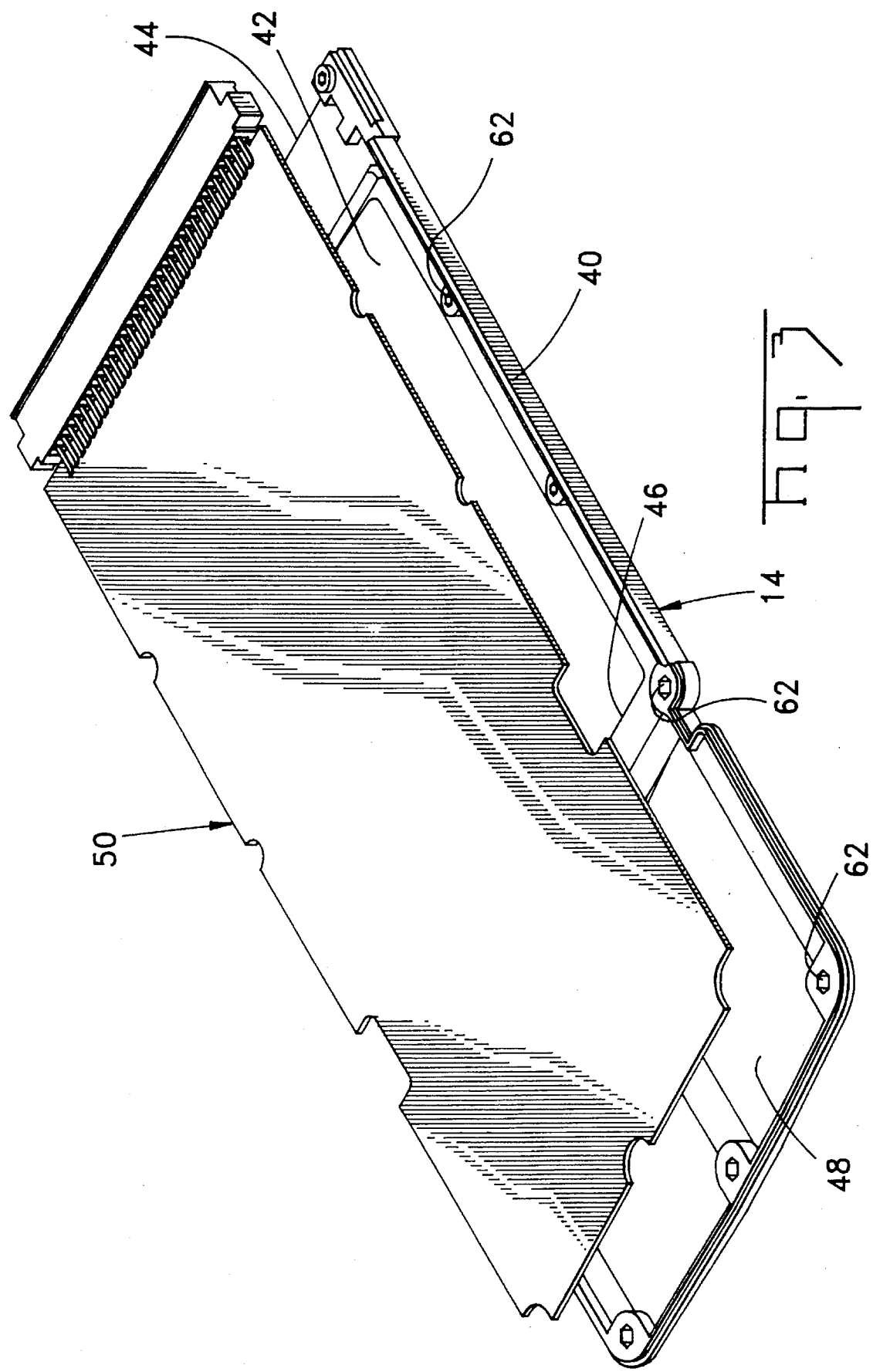

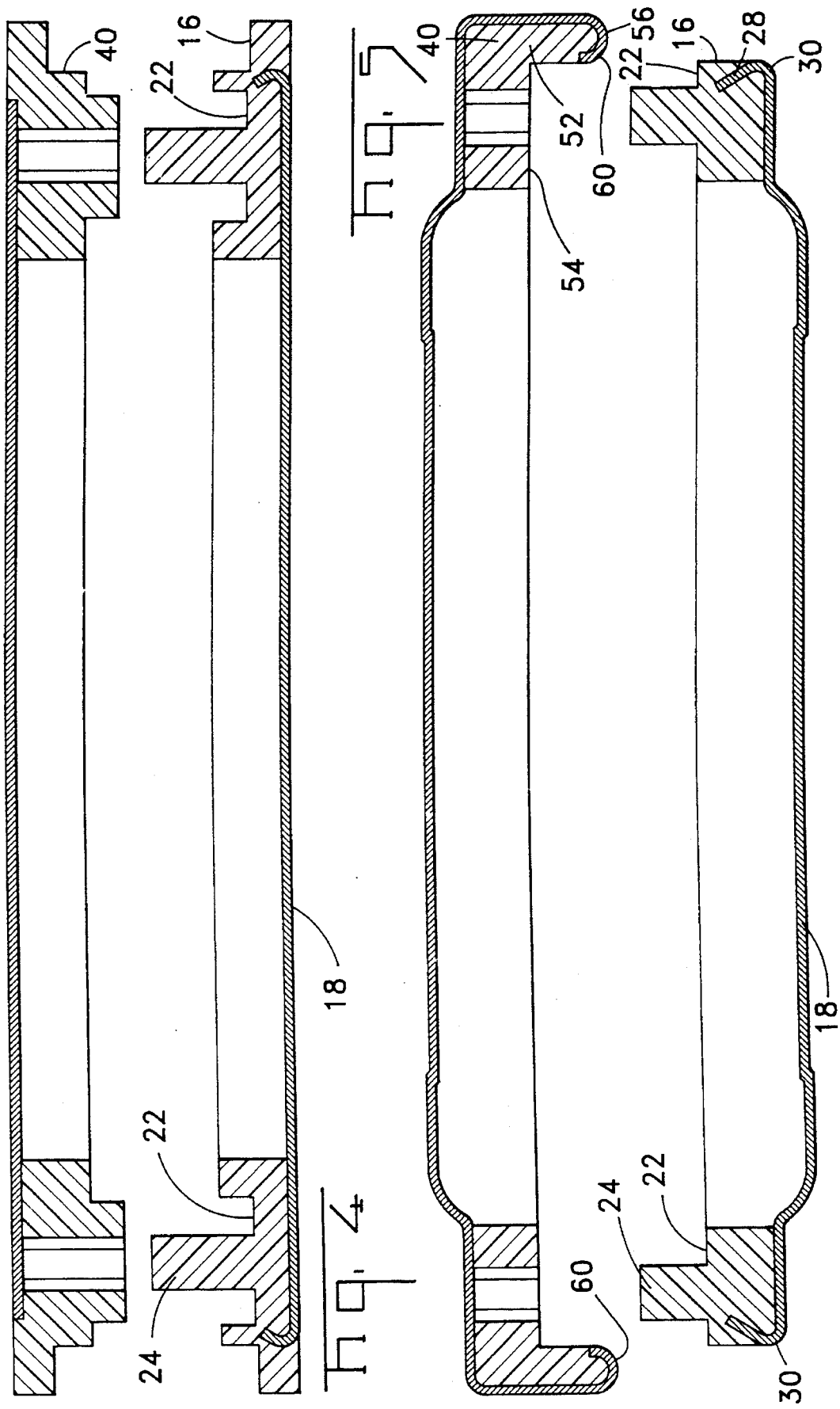

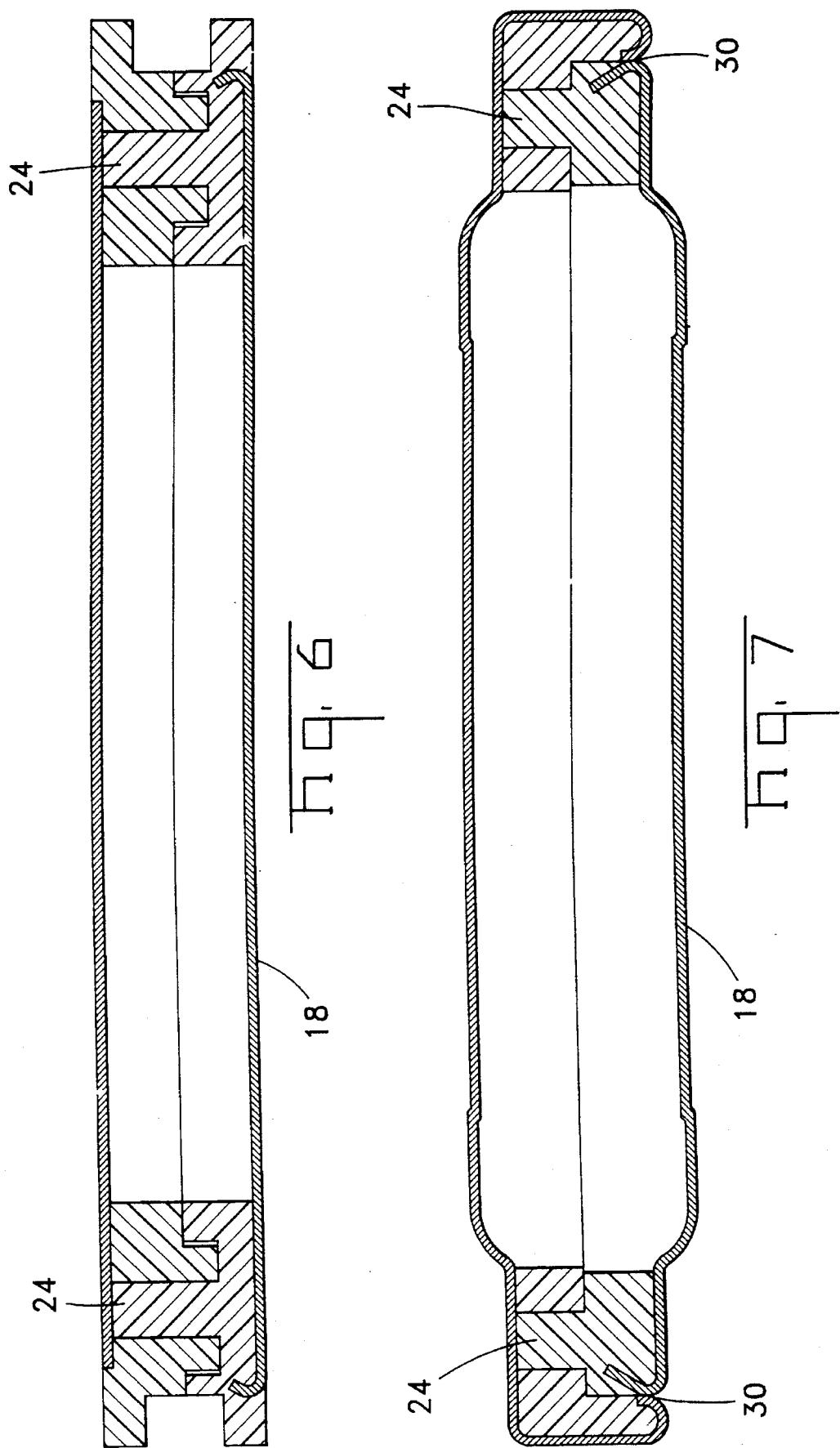

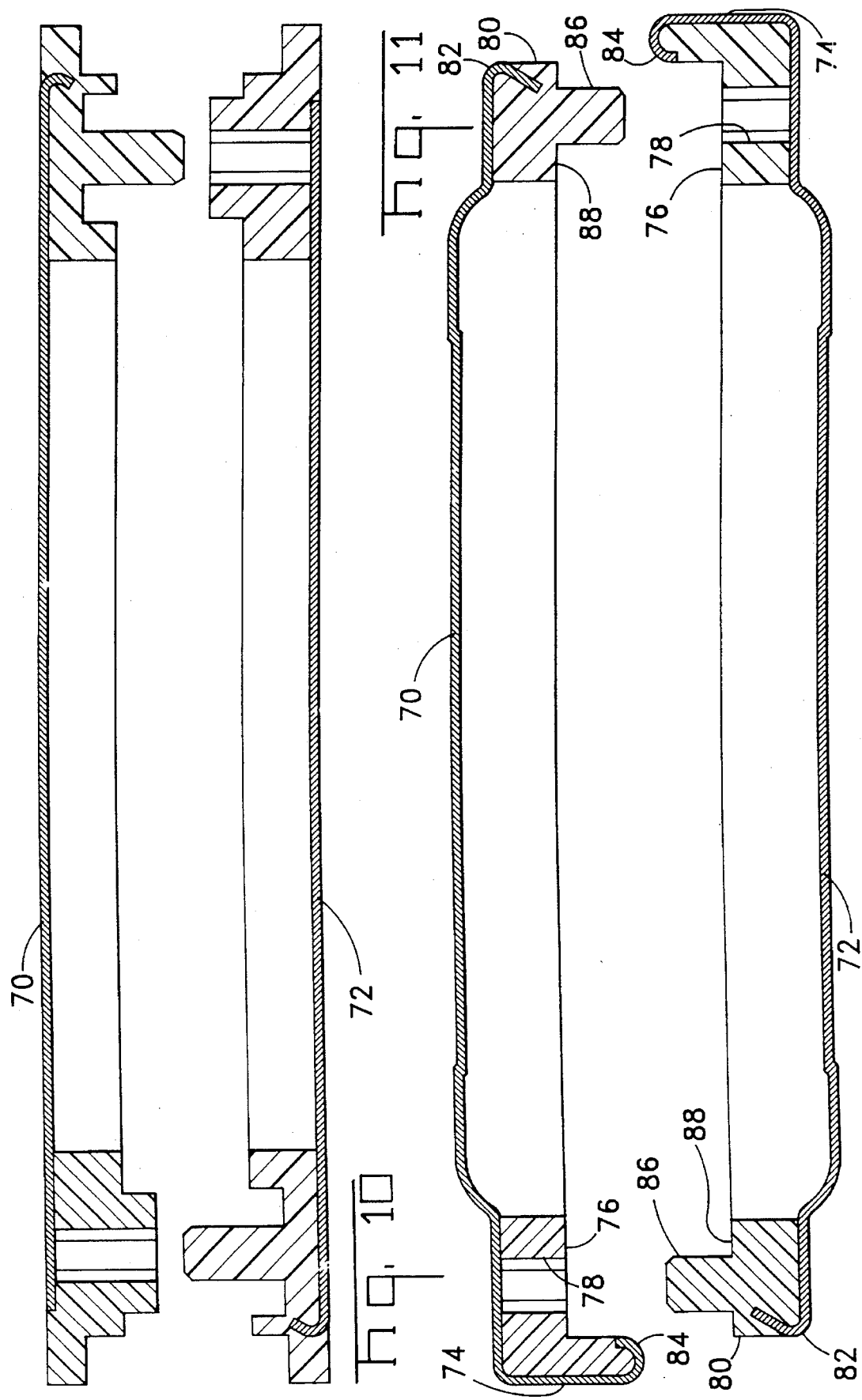

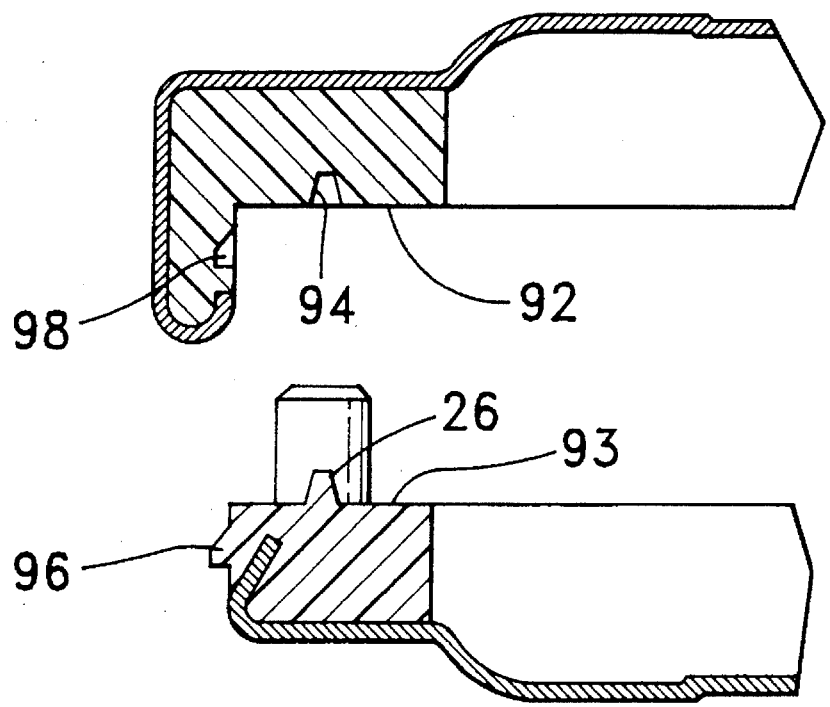

RIGID PCMCIA FRAME KIT

RELATED APPLICATION

This invention is directed to an improved PCMCIA frame kit that is easy to assemble, while providing structural integrity to the frame kit and protection to the contained planar electronic device, such as a conventional memory card, or the extended frame kit version as described in co-pending application, Ser. No. (Attorney Docket 16119), filed concurrently with this application as a joint invention by one of the inventors hereof.

BACKGROUND OF THE INVENTION

With the advent of sophisticated computers, facsimile machines, printers, and other computer-related electronics equipment, the need for an external printed circuit (PC) interface to be used by the computer and computer-related equipment is ever increasing. To this end, PC cards containing external memory and data to be used in computer processes have been designed. At the present time, there are three different PC card types, as defined by the Personal Computer Memory Card International Association (PCMCIA). This is the standards body responsible for developing the 68-pin PC card standard. The three PC card types, are as follows:

a. Type I PC Cards are the same width and length as a common credit card, 54 mm×85.6 mm, but are thicker than a credit card. The thickness of a Type I card is 3.3 mm (0.130").

b. Type II PC Cards are used by those companies which are utilizing memory components that are too high to be housed within a Type I card. Type II memory cards are also the same overall length and width as credit cards, but have raised body cross section in the substrate area which gives them an overall thickness of 5 mm (0.195"). The raised substrate areas of these cards are 48 mm in width.

c. Type III PC Cards are the result of a recent movement sponsored by the Small Form Factor Committee (SFF) to enable 1.8" Small Form Factor Disk Drives to be plugged into memory card connectors in small portable computer applications. Type III PC cards are the same length and width as Type I and Type II PC cards. However, Type III cards have a substrate area thickness of 10.5 mm. Also, Type III PC cards require a card guide opening width of 51 mm of the header connector to accommodate the slightly raised substrate area.

There is a move afoot to develop specialized or multipurpose memory cards, such as described in the concurrently filed co-pending application. This move has increased the need to provide greater stability to the frame kit containing the memory card.

By way of brief background, memory card holder or frame kit assemblies, comprise a printed circuit board, a casing or frame made of an insulting material for receiving the printed circuit board, metal shielding covers, and at least one connector, typically referred to an "I/O" connector. The connector is provided on one end of the casing or frame for interfacing the memory card, and particularly the printed circuit board contained in the casing, to the computer equipment to which the card is mated. The connector is designed to extract the contents of the memory stored on the printed circuit board and to bus data to and from an outside environment, which also usually comprises a computer or other electronic equipment. In this fashion, data traverses the interface between the PC card and the outside environment so that the data can be efficiently transferred and used by the computer to which the card is mated for its intended purpose.

PC cards are generally interchangeable and can be used with many different machines and electronic components. Because the PC cards are interchangeable, they undergo a significant amount of abuse when transported, interfaced and mated to the different computers and electronic equipment which use them. Since a PC card is conventionally made up of a number of layers and/or elements glued or otherwise bonded together, the individual layers tend to become loose and/or separated from one another as the memory card is subjected to flexing or torsional stresses, as may occur when the card is inserted into or removed from the electronic or other computer-type equipment. Thus, even after moderate amounts of usage, conventional memory cards have heretofore frequently become structurally loose, and the internal members of the card often become misaligned. This results in failure of the PC card and degrades the performance of the electronic equipment which uses the card. These undesirable results generally induce poor performance of the computer system which uses the memory card.

In U.S. Pat. No. 5,339,222, there is disclosed a memory card holder that provides a good degree of structural integrity to the assembly by the use of a pair of interfitting metal sheet-like cover members. Additionally the invention thereof provides continuous shielding against distortion of data signals between the PC or memory card and the I/O connector.

As an improvement to such prior art, U.S. patent application, Ser. No. 08/292,913, now abandoned, was recently filed in the USPTO, which application is assigned to the assignee hereof. The contents of the co-pending application is incorporated herein in its entirety. Briefly, the improved feature of the invention thereof is the provision of a first cover member of the frame kit having an inner planar surface in close proximity to the memory card, where the surface includes a torsion resistant, strengthening member bonded thereto. Preferable the strengthening member comprises a thin film of a thermo bonding plastic, where such bonding is achieved by the application of heat and pressure.

In a recent patent, U.S. Pat. No. 5,397,857, there is disclosed a memory card package which includes a pair of stamped and formed metal covers, each secured to a plastic frame element. The plastic frame element is injection molded around a plurality of fingers which extend from the periphery of the respective cover member. Further, the plastic frame element extends beyond the plane of the metal cover to expose a perimeter. By this arrangement, apparent bonding of the two covers is facilitated, where a preferred manner of bonding is by sonic welding.

The present invention offers an alternative approach to torsional resistance by providing peripherally arranged pins and sockets, press fit to one another, as the preferred means to secure the respective cover members to each other. This and other features will become apparent in the description which follows, particularly when read in conjunction with the accompanying drawings.

SUMMARY OF THE INVENTION

This invention relates to a stable and rigid PCMCIA frame kit for receiving a memory card, as known in the art, for electrical engagement with electronic equipment, such as a computer. The frame kit consists of a pair of matable, shielding cover members, where each cover member is integrally molded to a dielectric frame upon which the memory card is seated. The improved feature hereof is the provision of each frame including at least a pair of side rails, where the pair of side rails on one cover member includes plural, circular, upstanding pins having a predetermined diameter, and the pair of side rails on the other cover member includes a like plurality of holes. The cross section of the holes exhibit a multi-sided configuration with the diametrical distance between opposing corners being slightly greater than predetermined diameter of the pins, and the diametrical distance between opposing sides is slightly less than the predetermined diameter. By this arrangement, when a normal force is applied between the respective cover members a force fit is achieved between a respective pin and its multi-sided hole. In a preferred embodiment, the multi-side hole is a hexagon. Further, as an optional feature to enhance the stability of the frame kit, provision is made for localized sonic welding at the respective pin and hole locations by utilizing what is called a shear joint. Alternatively, the respective cover members may be essentially identical in construction, where each cover member includes pins along one side and sockets or holes along the opposite side. By flipping one cover member relative to the other, mating can be achieved, where the pins of one cover member are caused to engage corresponding sockets or holes in the other.

BRIEF DESCRIPTION OF DRAWINGS

FIG. 1 is a perspective view of a preferred embodiment of a PCMCIA frame kit incorporating the features of this invention.

FIG. 2 is an exploded perspective view of the pair of cover members forming the frame kit of FIG. 1, illustrating further, for example, details of the lower cover member along an interfacing edge surface.

FIG. 3 is an exploded perspective view similar to FIG. 2, but showing details of a complementary interfacing edge surface of the upper cover member, for example, and a prepositioned memory card with I/O connector for receipt in the frame kit.

FIG. 4 is a partial, longitudinal sectional view taken along line 4—4 of FIG. 2, showing the I/O connector end, or open end of the frame kit.

FIG. 5 is a transverse, sectional view taken along line 5—5 of FIG. 2.

FIG. 6 is a partial, longitudinal sectional view similar to FIG. 4, but showing the respective cover members in the assembled condition of FIG. 1.

FIG. 7 is a transverse, sectional view similar to FIG. 5, but showing the respective cover members in the assembled condition of FIG. 1.

FIG. 10 is a sectional view similar to FIG. 4, but showing an alternate embodiment with the use of a pair of hermaphroditic cover members to form the rigid PCMCIA frame kit of this invention.

FIG. 11 is a sectional view similar to FIG. 5, but showing the alternate embodiment of FIG. 10.

FIG. 12 is a partial transverse sectional view showing a complementary groove for receiving a rib to further stabilize the assembly against lateral movement.

DESCRIPTION OF PREFERRED EMBODIMENTS

Figure 8:
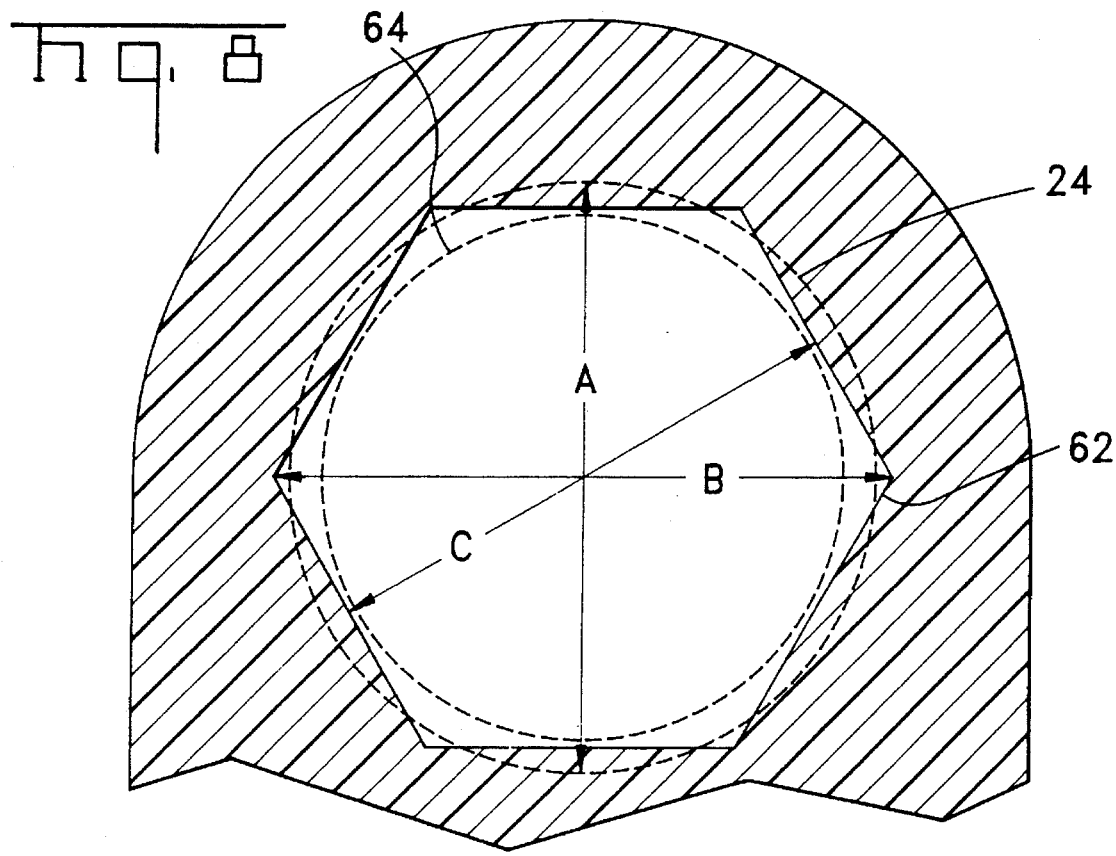
FIG. 8 is an enlarged, partial sectional view illustrating the preferred cross-sectional shape of the interfitting pin and socket elements along the respective interfacing edge surfaces of the cover members, prior to press fit engagement.

This invention relates to an improved PCMCIA frame kit that may be manually assembled, yet provides structural integrity to the frame kit and the contained memory card. The unique features offered by this invention are applicable to standard, shielded PCMCIA frame kits containing convention Types I, II and III PC Cards described above, or to newer customized frame kits, such as the shielded/unshielded version described in said related co-pending application, the contents of which are incorporated herein by reference in its entirety.

FIG. 1 illustrates a preferred customized frame kit 10 incorporating the integrity enhancing features of this invention. As more clearly illustrated by the details in the remaining FIGURES, the frame kit 10 comprises a lower cover member 12 and an upper cover member 14, where such cover members intermate to form the frame kit of FIG. 1.

Turning first to the lower cover member 12, illustrated as the lower component in FIGS. 2, 4 and 5, it will be seen that such member comprises a perpherial dielectric frame 16 and a stamped and formed metal shield 18 injection molded to said frame to form the integral cover member 12.

In this preferred embodiment, the metal shield 18 is over only a portion of the frame kit 10, with the balance thereof consisting of a longitudinal extension 20, the function of which is detailed in said related co-pending case. Suffice to say, whether using a fully shielded or partially shielded frame kit, the dielectric frame 16 defines the peripheral extent of the assembly. The dielectric frame 16, about the periphery, includes a mating surface 22 having plural, spaced-apart circular pins 24, where the diameter thereof has a preset diametrical dimension. Further, disposed along such mating surface 22, between certain adjacent said pins 24, are plural, longitudinally oriented ribs 26, the function of which will be apparent in the discussion later. Finally, as best seen in FIG. 5, the metal shield 18 includes an upturned edge 28 within the dielectric frame 16, where the base 30 thereof is exposed outside the frame side 32. As will become apparent in the discussion of the upper cover member 14, it is with this base 30 that continuous shielding between the respective cover members is achieved.

The upper cover members 14, depicted as the top component in FIGS. 4 and 5, is also illustrated in FIG. 3, but from the underside thereof to show mating detail. Like the complementary lower cover member 12, the upper cover member 14 comprises a peripheral dielectric frame 40 and a stamped and formed metal shield 42 injection molded to the frame 40 to form the integral cover member 14. In the illustrated embodiment, the metal shield 42 is over a portion of the frame 40, from the I/O connector end 44 to a midpoint or transition area 46. Beyond the transition area 46 is a dielectric extension 48 which is complementary to and matable with the longitudinal extension 20 on the lower cover member 12. Such extensions 20, 48, when fully mated define a cavity therebetween for receiving a portion of the memory card 50 therein, note FIG. 3.

The upper cover member 14, as best seen in FIG. 5, particularly the frame 40, includes along the sides thereof a downwardly extending flange 52 and a lateral mating surface 54. In the injection molding process, the flange 52 is formed within a formed channel 56 of the metal shield 42. With the channel end 60 reversely bent 180°, thereby exposing such end interiorly, a metal-to-metal contact is provided with base 30 of the lower cover member 12 in the assembled condition, see FIG. 7.

Opening into the lateral mating surface 54 are plural sockets holes 62, one hole aligned with said upstanding circular pin 24 of the lower cover member 12, note FIG. 5. While such pins 24 are circular in configuration, having a preset diametrical dimension, the holes 62 may be characterized as multi-sided in cross-section, where a preferred shape is a hexagon. The enlarged sectional view in FIG. 8 illustrates the relationship between a pin 24 and its complementary (hexagonal) hole 62. What appears to be an impossible task to mate same, is quite feasible considering the respective dimensions of the pin and hole, and the use of a plastic or dielectric material that yields or deforms under the application of pressure. A suitable dielectric material for the respective frames is a liquid crystal polymer (LCP) or nylon. Returning again to FIG. 8, the pins 24, at the free end thereof are slightly tapered to present a reduced diameter 64 and thereby avoid stubbing on the initial mating of a pin 24 and its corresponding hole 62. The relationship between the pin diameter and reduced diameter of the end is depicted by the concentric dotted lines in FIG. 8. The cross-sectional of the pin 24 to its corresponding hole 62 is as follows:

where the diameter of the pin is a preset dimension (A) and, the diametrical distance between opposing corners of a pair of adjacent walls of the hole is (B), then B>A. Further, where the diametrical distance between midpoints of opposing walls is (C), then A>C.

Figure 9:
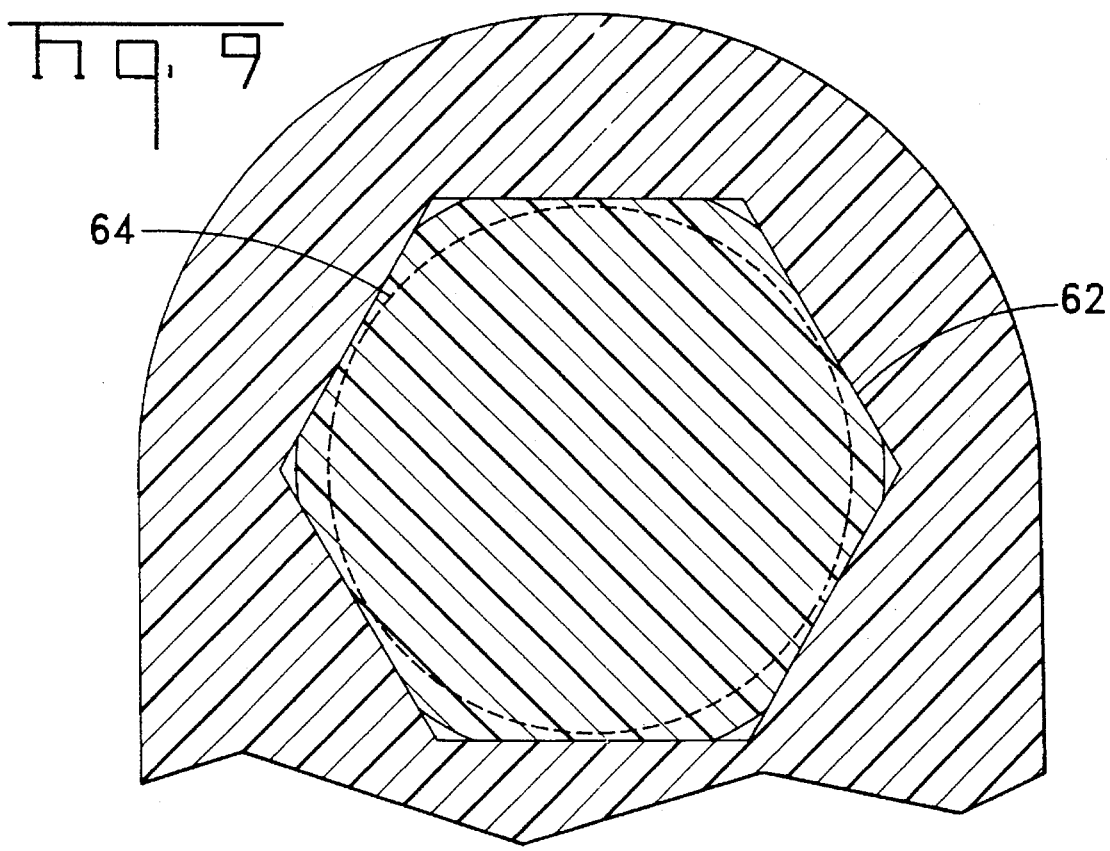
FIG. 9 is an enlarged, partial sectional view similar to FIG. 8, but showing the section through an exemplary press fit pin and socket elements.

By this sizing arrangement, there is sufficient open space within the hole to allow some cooperative displacement or material flow during mating, i.e. press fitting the pin into its corresponding hole. FIG. 9 is a sectional view of the mated or press fit arrangement of FIG. 8.

An alternate embodiment, while incorporating the unique features of this invention, offers some manufacturing savings, see FIGS. 10 and 11. In the embodiment of FIG. 11, the respective cover members 70, 72 are identical such that a pair may be intermated to form a structurally sound PCMCIA frame kit offering the advantages of this invention. By the provision of a pair of hermaphroditic cover members, only a single, integrated frame and metal shield need be manufactured.

In FIG. 11, for example, it will be noted that each matable cover member 70, 72, includes a wrap around metal member 74 along one longitudinal side, a mating surface 76, and a plurality of aligned multi-sided holes 78, preferably hexagonal in cross-section, opening into the mating surface. In a complementary manner, the opposite longitudinal side of each cover member 70, 72 includes a dielectric side rail 80 having an edge 82 of the metal shield insert molded therewithin, where a base 82 of the metal shield is exposed for metal-to-metal contact by the opposing or mating cover member, a mating surface 84, and plural, complementary circular pins 86 upstanding from the mating surface 88. It will be understood that the dimensions and preferred shapes and cross-sections of the respective pins and holes are as discussed above relative to the embodiment of FIGS. 2–9, and will not be repeated here.

There are two optional features which may be utilized herein to enhance the stability of the assembled frame kit. Along the respective mating surfaces 92, 93 of the frame periphery, a rib 26 and complementary groove 94 may be provided, where the rib seats within such groove. By this arrangement, a resistance to lateral movement of one cover member to the other is achieved. As a further stability enhancing feature, one may wish to use sonic welding. Specifically, the pins in the respective holes about the frame kit can be sonic welded utilizing what is called a shear joint. Alternately, as best seen in FIG. 12, laterally projecting ribs or 96 may be incorporated about the frame periphery of one cover member for mating, by snap engagement, with complementary notches 98 located in the other cover member, where localized sonic welding, as known and practiced in the art, can be performed.

We claim:

1. In a PCMCIA frame kit for receiving a planar electronic device for electrical engagement with a complementary device in electronic equipment, said kit comprising a pair of matable, metal cover members, where each said cover member is integrally molded to a dielectric frame upon which said planar electronic device is seated, the improvement comprising in combination therewith the provision of each said frame including at least a pair of side rails, where said pair of side rails on one cover member includes plural, circular, upstanding pins having a predetermined diameter, and said pair of side rails on the other cover member including a like plurality of holes, where the cross section of said holes exhibits a multi-sided configuration with the diametrical distance between opposing corners being slightly greater than said predetermined diameter, and the diametrical distance between opposing said sides is slightly less than said predetermined diameter, whereby a normal force applied between said covers effects a force fit between each respective pin and its multi-sided hole.

2. The PCMCIA frame kit according to claim 1, wherein said multi-sided configuration is a hexagon.

3. The PCMCIA frame kit according to claim 1, wherein one pair of said side rails includes a narrow groove along a mating surface thereof.

4. The PCMCIA frame kit according to claim 3, wherein said side rails of the other cover member includes a complementary narrow rib engagable with said corresponding groove.

5. The PCMCIA frame kit according to claim 4, wherein through the engagement of respective grooves and ribs said engagement offers improved stability to the assembled frame kit.

6. The PCMCIA frame kit according to claim 1, wherein said frame kit is generally rectangular in shape, and that said cover members include side rails along three sides, with the fourth side open to expose said planar electronic device for mating with an electrical connector.

7. The PCMCIA frame kit according to claim 1, wherein the assembled frame kit maybe be subjected to localized sonic welding to effect a weld between said engaged pin and its respective said hole.

8. The PCMCIA frame kit according to claim 1, wherein a free end of each said circular pin is tapered to facilitate entry into a respective said multi-sided hole.

9. The PCMCIA frame kit according to claim 1, wherein a plurality of ribs are provided about the side of the peripheral frame of one cover member, and the other cover member includes a like plurality of notches, where a snap engagement of said cover members is achieved through mating of each ribs to its respective notch.

10. The PCMCIA frame kit according to claim 9, wherein sonic welding may be applied to each mated ribs and notch to further stabilize the assembled frame kit.

11. In a PCMCIA frame kit for receiving a planar electronic device for electrical engagement with a complementary device in electronic equipment, said kit comprising a pair of matable, metal cover members, where each said cover member is integrally molded to a dielectric frame upon which said planar electronic device is seated, the improvement comprising in combination therewith the provision of each said integral cover member and dielectric being essentially identical to one another, and that each said frame includes a first and second side rail, where said first side rail includes a plural, circular, upstanding pins having a predetermined diameter, and said second side rail includes a like plurality of holes, where the cross section of said holes exhibit a multi-sided configuration with the diametrical distance between opposing corners being slightly greater than said predetermined diameter, and the diametrical distance between opposing said sides is slightly less than said predetermined diameter, whereby a normal force applied between said covers effects a force fit between the respective pins of said first side rail and the multi-side hole of the second side rail of the other cover member.

12. The PCMCIA frame kit according to claim 11, wherein said multi-sided configuration is a hexagon.

13. The PCMCIA frame kit according to claim 11, wherein one pair of said side rails includes a narrow groove along a mating surface thereof.

14. The PCMCIA frame kit according to claim 13, wherein said side rails of the other cover member includes a complementary narrow rib engagable with said corresponding groove.

15. The PCMCIA frame kit according to claim 14, wherein through the engagement of respective grooves and ribs said engagement offers improved stability to the assembled frame kit.

16. The PCMCIA frame kit according to claim 11, wherein said frame kit is generally rectangular in shape, and that said cover members include side rails along three sides, with the fourth side open to expose said planar electronic device for mating with an electrical connector.

17. The PCMCIA frame kit according to claim 11, wherein the assembled frame kit may be subjected to localized sonic welding to effect a weld between said engaged pin and its respective said hole.

18. The PCMCIA frame kit according to claim 11, wherein a free end of each said circular pin in tapered to facilitate entry into a respective said multi-sided hole.

19. The PCMCIA frame kit according to claim 11, wherein a plurality of ribs are provided about the side of the peripheral frame of one cover member, and the other cover member includes a like plurality of notches, where a snap engagement of said cover members is achieved through mating of each ribs to its respective notch.

20. The PCMCIA frame kit according to claim 19, wherein sonic welding may be applied to each mated ribs and notch to further stabilize the assembled frame kit.

* * * * *